United States Patent
Choi et al.

(10) Patent No.: US 9,019,786 B2
(45) Date of Patent: Apr. 28, 2015

(54) REPAIR SYSTEM FOR REPAIRING DEFECT USING E FUSES AND METHOD OF CONTROLLING THE SAME

(71) Applicant: SK Hynix Inc., Icheon-si, Gyeonggi-do (KR)

(72) Inventors: Jun Gi Choi, Icheon-si (KR); Choong Man Jung, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 204 days.

(21) Appl. No.: 13/720,847

(22) Filed: Dec. 19, 2012

(65) Prior Publication Data

US 2014/0063993 A1    Mar. 6, 2014

(30) Foreign Application Priority Data

Aug. 29, 2012  (KR) .......................... 10-2012-0095215

(51) Int. Cl.
*G11C 29/00*  (2006.01)
*G11C 29/44*  (2006.01)

(52) U.S. Cl.
CPC ............ *G11C 29/787* (2013.01); *G11C 29/006* (2013.01); *G11C 29/802* (2013.01); *G11C 2029/4402* (2013.01)

(58) Field of Classification Search
CPC .. G11C 29/4401; G11C 29/787; G11C 17/16; G11C 2029/4402; G11C 29/027; G11C 2229/763; G11C 29/44; G11C 29/88; G11C 29/02; G11B 20/1883; G06F 11/0793
USPC ......... 714/42, 720, 711; 365/200, 189.05, 96, 365/225.7, 201
See application file for complete search history.

(56) References Cited

U.S. PATENT DOCUMENTS

| | | | |
|---|---|---|---|
| 7,730,372 B2 | 6/2010 | Farnworth et al. | |
| 7,751,264 B1* | 7/2010 | Wu et al. ..................... | 365/200 |
| 2005/0132255 A1* | 6/2005 | Tran et al. .................... | 714/42 |
| 2007/0195623 A1* | 8/2007 | Callaway et al. ............ | 365/201 |

FOREIGN PATENT DOCUMENTS

| | | |
|---|---|---|
| JP | 2003338193 A | 11/2003 |
| KR | 1020070062077 A | 6/2007 |

* cited by examiner

*Primary Examiner* — Richard Elms
*Assistant Examiner* — Ajay Ojha
(74) *Attorney, Agent, or Firm* — William Park & Associates Ltd.

(57) ABSTRACT

A system for repairing a plurality of semiconductor chips each comprising a data storage region including electric fuses connected to the data storage regions of the plurality of semiconductor chips, a defect determination unit configured to read the data of a chip that is actually accessed and the data of an idle chip in the data storage regions, compare the actually accessed and read data with the data of the idle chip, and detect a defect based on a result of the comparison, a storage unit configured to store the defective position of the defect according to a result of the defect determination unit, and a repair unit configured to repair the defect through an E fuse connected to the position of the defect using a reset signal.

12 Claims, 3 Drawing Sheets

REPAIR SYSTEM FOR REPAIRING DEFECT USING E FUSES AND METHOD OF CONTROLLING THE SAME

CROSS-REFERENCES TO RELATED APPLICATION

The present application claims priority under 35 U.S.C. §119(a) to Korean application number 10-2012-0095215, filed on Aug. 29, 2012, in the Korean Intellectual Property Office, which is incorporated herein by reference in its entirety.

BACKGROUND

1. Technical Field

The present invention generally relates to a semiconductor module, and more particularly, to the repair system of a semiconductor module for repairing a defect using electric fuses and a method of controlling the same.

2. Related Art

With a recent increase in the amount of processed video data in the fields, such as computers, mobile phones, and smart chip cards, a required capacity of memory is suddenly increasing. For example, in the computer field, video RAM for a graphic board requires a high capacity because the processing speed of a CPU becomes several hundreds of GHz. Furthermore, in the mobile phone field, color video data is processed because a display device becomes colorful and a high capacity of memory is required because the amount of personal communication data through wireless web service increases. In the mobile phone field and the smart chip card field, a module system of a high-capacity multi-chip form is required due to a limited mounting space.

In general, in a semiconductor memory, such as RAM, or a semiconductor integrated circuit in which a memory circuit is embedded, a yield is improved by repairing a defective bit included in a memory array using a redundancy circuit equipped with an address circuit for storing redundant memory columns, memory rows, and defective addresses.

In this redundancy circuit, when setting a defective address, a method of using a fuse that can be programmed by physical opening or breaking through a laser is commonly used. For example, there is a repair method of cutting a fuse using a laser, storing information on a defective address, comparing the defective address with an input address, and replacing the defective address with a redundant memory row or a redundant memory column according to a result of the comparison. The fuse must be cut before a memory chip is sealed in a package. For this reason, it is not easy to repair a defect generated after the memory chip is packaged.

For example, if a defect occurs during a mounting test after mounting chips in a module form, the chips must be extracted from the module, a defective position must be checked while decapsulating the extracted chips one by one, and a defect must be repaired using a laser. As described above, in order to detect, verify, and repair a defect in chips of a module form, a lot of time and costs must be consumed.

SUMMARY

In an embodiment, the repair system of a semiconductor module is a repair system for repairing a plurality of semiconductor chips each comprising a data storage region. The repair system includes electric fuses connected to the data storage regions of the plurality of semiconductor chips, a defect determination unit configured to read the data of a chip that is actually accessed and the data of an idle chip in the data storage regions, compare the actually accessed and read data with the data of the idle chip, and detect a defect based on a result of the comparison, a storage unit configured to store the defective position of the defect according to a result of the defect determination unit, and a repair unit configured to repair the defect through an E fuse connected to the position of the defect using a reset signal.

In an embodiment, a method of repairing a semiconductor module includes providing first and second semiconductor chips that have been mounted, writing identical data in the first and the second semiconductor chips during a mounting test, reading data stored in the first and the second semiconductor chips, respectively, comparing the read data with each other, and detecting a defect based on a result of the comparison, storing the defective position of the defect according to a result of the detection, and replacing the defect of the stored defective position in response to a reset signal.

In accordance with an embodiment, a repair method including testing a semiconductor module in a state in which the semiconductor module has been mounted, storing defective data detected while testing the semiconductor module, repairing the stored defective data by replacing the stored defective data with normal data, and normally operating the semiconductor module.

BRIEF DESCRIPTION OF THE DRAWINGS

Features, aspects, and embodiments are described in conjunction with the attached drawings, in which.

DETAILED DESCRIPTION

Hereinafter, the repair system of a semiconductor module and a method of controlling the same according to various embodiments will be described below with reference to the accompanying drawings through the embodiments.

Figure 1:
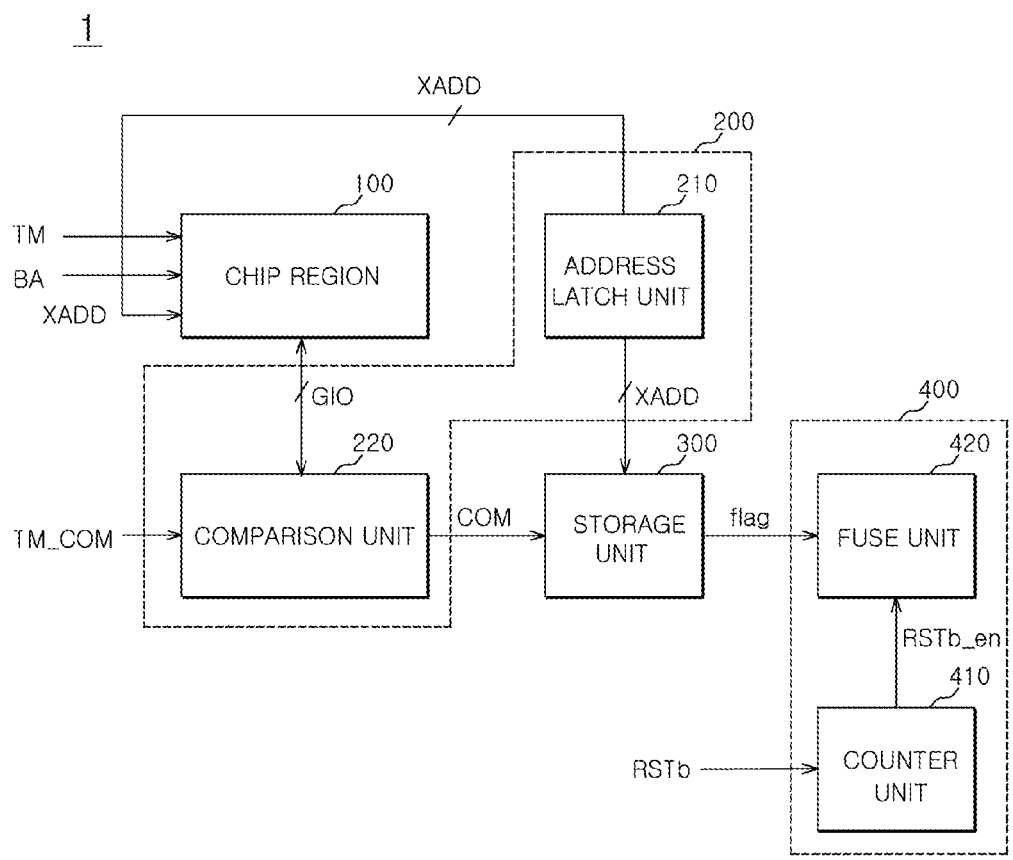
FIG. 1 shows the construction of the repair system of a semiconductor module in accordance with an embodiment.

FIG. 1 shows the construction of the repair system of a semiconductor module in accordance with an embodiment.

Referring to FIG. 1, the repair system 1 of a semiconductor module may include a chip region 100 configured to have chips (not shown) mounted thereon, a defect determination unit 200 configured to detect a defect by reading data stored in the chip region 100, a storage unit 300 configured to store a defective position at which a defect has occurred, and a repair unit 400 configured to replace the defect in response to a reset signal.

The chip region 100 receives a test mode signal TM, a band address BA, and a row address XADD and transmits and receives data to and from the defect determination unit 200.

Additionally, the defect determination unit 200 may include an address latch unit 210 and a comparison unit 220. The address latch unit 210 can be a common address latch unit for latching the row address XADD supplied from the outside (not shown).

The comparison unit 220 can read the data of a chip within the chip region 100, that is, the data of a chip that is actually accessed, and the data of an idle chip and compare the actually accessed and read data with the data of the idle chip. The comparison unit 220 provides a comparison result signal COM to the storage unit 300 in response to a comparison enable signal TM_COM.

The storage unit 300 may store a defective address when a defect occurs in each chip. That is, when a defect occurs, the storage unit 300 may receive the comparison result signal COM, receive an address for a defective position from the address latch unit 210, and provide a flag signal flag.

The repair unit 400 may be configured to receive information on a defect stored in the storage unit 300 and replace the defect when a rupture signal RSTb-en is enabled. The repair unit 400 may include a counter unit 410 configured to respond to a reset signal RSTb and a fuse unit 420 configured to receive the flag signal flag.

The counter unit 410 is described in detail. The counter unit 410 may count the number of reset signals RSTb and generate the rupture signal RSTb-en when the number of reset signals RSTb reaches a specific number. For example, the counter unit 410 can recognize the time when the number of reset signals RSTb reaches 10 as rupture mode and generate the rupture signal RSTb-en.

The fuse unit 420 can fuse a defective address in response to the rupture signal RSTb-en and the flag signal flag. The fuse unit 420 may include a plurality of electrical (E) fuses (not shown). More particularly, the fuse unit 420 can block a defective address by electrically shorting the defective address in response to the rupture signal RSTb-en and the flag signal flag and repair a defect by replacing the defective address with a new repair address. The fusing function of the fuse unit 420 can be understood as a common fuse box.

Figure 2:
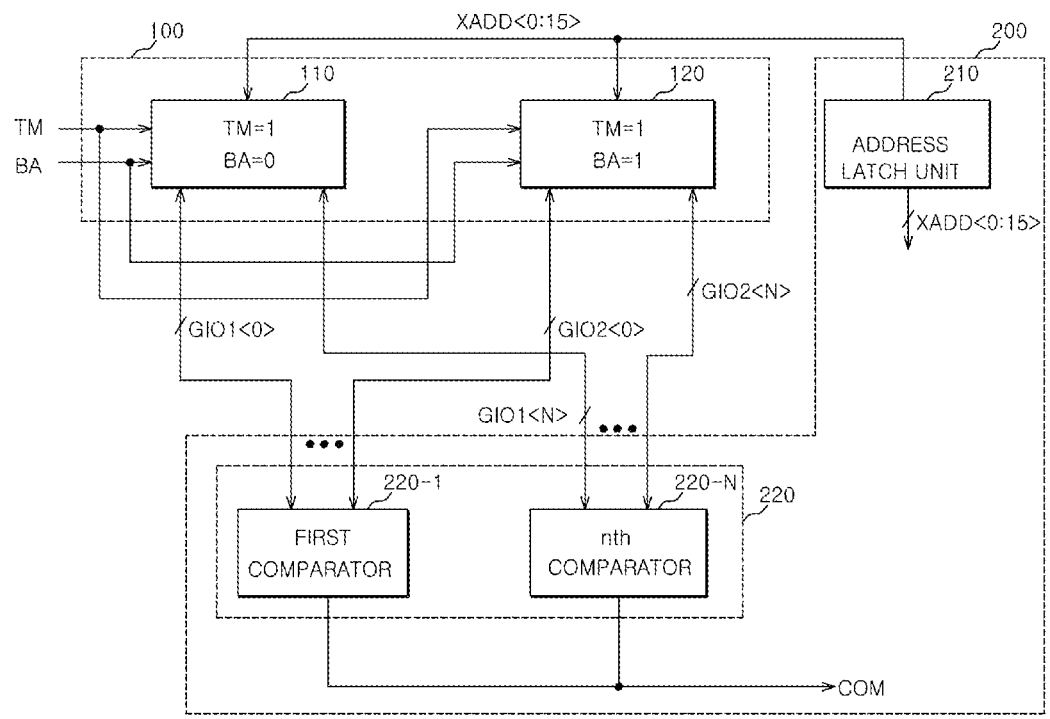
FIG. 2 is a detailed block diagram of part of the repair system of FIG. 1.

FIG. 2 is a detailed block diagram of part of the repair system 1 of FIG. 1.

Referring to FIG. 2, the chip region 100 may include a first semiconductor chip 110 and a second semiconductor chip 120, for example.

If the chip region 100 is considered as a module, the first and the second semiconductor chips 110 and 120 can be considered as multiple chips having the same memory size.

It is assumed that in the state in which the first and the second semiconductor chips 110 and 120 are actually mounted, in density reduction mode test, the test mode signal TM is enabled (i.e., TM=1) and any one of the two chips is tested using the band address BA.

Intensity reduction mode means that a 4G module, for example, is tested like a 2G module in the intensity reduction mode test and only any one of two chips is accessed. The first and the second semiconductor chips 110 and 120 can receive a row address in common from the address latch unit 210 through a common address line (i.e., XADD<0:15>).

The comparison unit 220 may include a first comparator 220-1 to an $n^{th}$ comparator 220-N. The first comparator 220-1 may be connected to first global input/output (I/O) lines GIO1<0>, GIO2<0> through which data may be transmitted and received to and from the first and the second semiconductor chips 110 and 120. The $n^{th}$ comparator 220-2 may be connected to $n^{th}$ global I/O lines GIO1<N>, GIO2<N> through which data is transmitted and received to and from the first and the second semiconductor chips 110 and 120. The number of comparators is related to the number of I/O pins of the first and the second semiconductor chips 110 and 120.

In a mounting test in accordance with an embodiment, even when only any one of the first and the second semiconductor chips 110 and 120 is actually tested, data is written into the first and the second semiconductor chips 110 and 120 at substantially the same time in accordance with an embodiment.

When data is subsequently read, the data of a semiconductor chip region that is actually accessed and the data of a semiconductor chip region of an idle state are read in response to the comparison enable signal TM_COM through the comparators 220-1~220-N. The actually accessed data is compared with the data of the semiconductor chip region of an idle state. Whether or not a defect has occurred in the chip is determined based on a result of the comparison, and the comparison result signal COM according to a result of the determination is provided.

When a defect occurs, an operation of repairing the defect is necessary.

Figure 3:
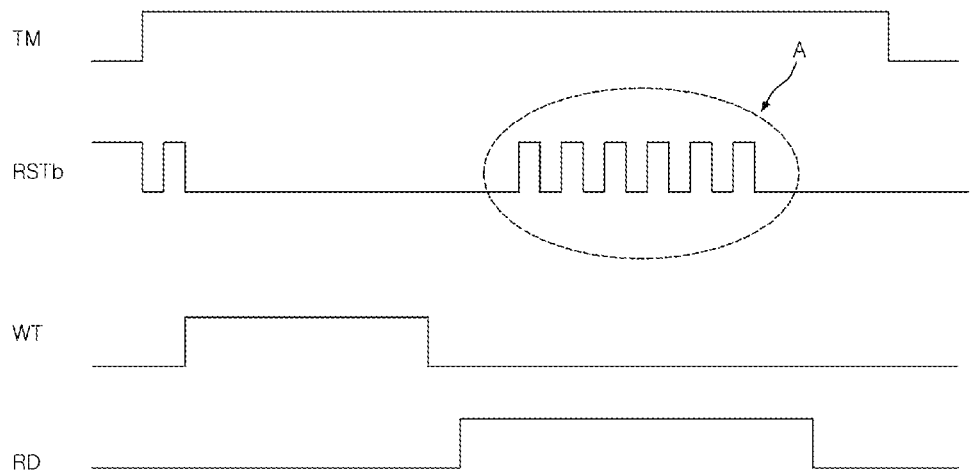
FIG. 3 shows a timing diagram of a variety of signals of the semiconductor module of FIG. 1.

FIG. 3 is a timing diagram that shows this operation in the form of operating waveforms.

Referring to FIGS. 1 to 3, when test mode is entered (i.e., see test mode signal TM of FIG. 3), the reset signal RSTb resets the initial operation of a semiconductor module.

Next, a write signal WT is provided so that data may be written into the first and the second semiconductor chips 110 and 120 at the same time or substantially the same time. After the data is fully written into the first and the second semiconductor chips 110 and 120, the data written into the first and the second semiconductor chips 110 and 120 is read in response to a read signal RD.

The write and read signals WT and RD may be commands supplied from a common semiconductor device.

If a defective cell is included in the first and the second semiconductor chips 110 and 120, the comparison result signal COM is provided in the state in which the comparison result signal COM is enabled.

At this time, the storage unit 300 may receive an address from the address latch unit 210 and obtain the row address XADD at which the defect has occurred. The storage unit 300 may generate the flag signal flag informing that the defect has occurred.

Additionally, after some time, for example, when the number of reset signals RSTb reaches a specific number while the data is read, the counter unit 410 may generate the rupture signal RSTb-en so that rupture mode A can be entered.

When rupture mode is entered and the flag signal flag is enabled, the fuse unit 420 shorts a fuse by supplying an electrical signal, so that the defective address can be replace with a new repair address. The fuse unit 420 can be understood as a common E fuse box.

In other words, in accordance with an embodiment, when a defect occurs, information on the occurrence of the defect is latched, the flag signal is generated, and rupture mode is entered according to the number of reset signals RSTb.

In the prior art, it may be difficult to repair a defect occurred in a mounted module, that is, a sealed chip. Furthermore, when performing test mode, a variety of function tests, a parameter test, and AC and DC tests are performed according to a series of task sequences. It is impossible to additionally perform a specific defect repair task during the predetermined test sequences.

In accordance with an embodiment associated with FIGS. 1-3, however, control is performed so that rupture mode is entered by counting the number of reset signals RSTb without using an additional physical method or supplying a signal. When rupture mode is entered, a defect can be repaired using an E fuse in the state in which a module has not been broken.

Figure 4:
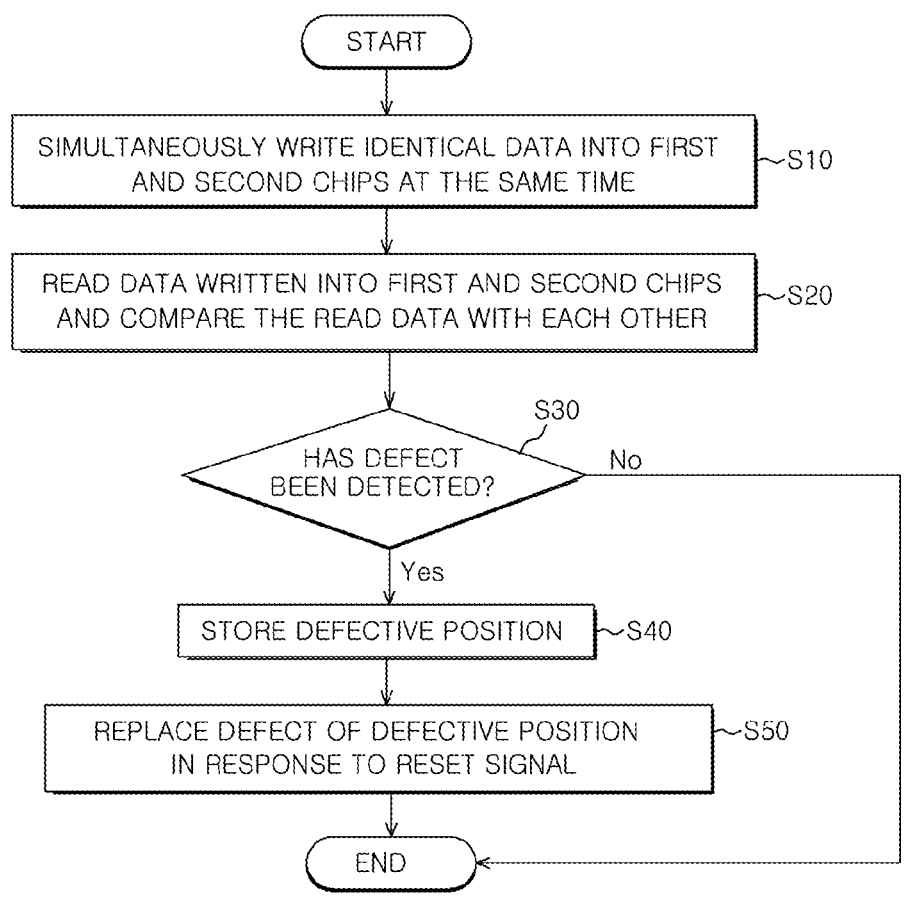
FIG. 4 is a flowchart illustrating a method of repairing the semiconductor module of FIG. 1.

FIG. 4 is a flowchart illustrating a method of repairing a semiconductor module in accordance with an embodiment.

Referring to FIG. 4, first, the same data is written into the first and the second semiconductor chips 110 and 120 at substantially the same time at step S10 (i.e., SIMULTA-

NEOUSLY WRITE IDENTICAL DATA INTO FIRST AND SECOND CHIPS AT THE SAME TIME).

The data written into the first and the second semiconductor chips 110 and 120 is read and compared with each other at step S20 (i.e., READ DATA WRITTEN INTO FIRST AND SECOND CHIPS AND COMPARE THE READ DATA WITH EACH OTHER).

If, as a result of the comparison, the written data is identical with each other (No at step S30, that is, a defect has not been detected), a defect repair operation is not performed.

If, as a result of the comparison, however, the written data is not identical with each other (Yes at step S30, that is, a defect has been detected), information on a defective position is stored at step S40 (i.e., STORE DEFECTIVE POSITION). The information on the defective position can be information on an address at which the defect has occurred.

Next, the defect at the stored position is replaced in response to the reset signal RSTb at step S50 (i.e., REPLACE DEFECT OF DEFECTIVE POSITION IN RESPONSE TO RESET SIGNAL).

As described above, in accordance with the embodiments, a defect can be repaired using the reset signal RSTb and the E fuses without even opening a module physically.

Furthermore, since a defect occurred in a semiconductor module can be easily repaired, the yield of a test process and quality can be improved.

While various embodiments have been described above, it will be understood to those skilled in the art that the embodiments described are by way of example only. Accordingly, the repair system and method described herein should not be limited based on the described embodiments.

What is claimed is:

1. A repair system for repairing a plurality of semiconductor chips each comprising a data storage region, the system comprising:
   electric fuses connected to the data storage regions of the plurality of semiconductor chips;
   a defect determination unit configured to read data of a chip that is actually accessed and data of an idle chip in the data storage regions, compare the actually accessed and read data with the data of the idle chip, and detect a defect based on a result of the comparison;
   a storage unit configured to store a defective position of the defect according to a result of the defect determination unit; and
   a repair unit configured to repair the defect through an E fuse connected to the position of the defect using a reset signal,
   wherein the repair unit comprises a counter unit for counting a number of the reset signals and generating a rupture signal when the number of reset signals reaches a specific number.

2. The repair system according to claim 1, wherein the defect determination unit comprises:
   a plurality of input/output (I/O) lines connected to the respective semiconductor chips; and
   a comparison unit connected to the plurality of I/O lines.

3. The repair system according to claim 2, wherein the comparison unit comprises comparators, the number of comparators being related to the number of I/O pins of the semiconductor chips.

4. The repair system according to claim 1, wherein the repair unit is configured to receive information on the defective position stored in the storage unit and to replace a memory storage region of the defective position when the rupture signal is enabled.

5. The repair system according to claim 4, wherein the repair unit comprises a fuse unit configured for receiving the rupture signal and for shorting the electric fuses by supplying an electrical signal.

6. The repair system according to claim 4, wherein the repair unit shorts the E fuse connected to the defective position in response to the rupture signal.

7. The repair system according to claim 1, wherein the plurality of semiconductor chips receives a stored common data from a common address line.

8. A repair method, comprising:
   providing first and second semiconductor chips that have been mounted;
   writing identical data in the first and the second semiconductor chips during a mounting test;
   reading data stored in the first and the second semiconductor chips, respectively, comparing the read data with each other, and detecting a defect based on a result of the comparison;
   storing a defective position of the defect according to a result of the detection; and
   replacing the defect of the stored defective position according to a rupture signal,
   wherein the rupture signal is set so that the rupture signal is enabled when a number of reset signals reaches a specific number.

9. The repair method according to claim 8, wherein the replacing of the defect of the stored defective position in response to a reset signal comprises:
   generating the rupture signal in response to the number of the reset signals generated in a reset operation; and
   repairing the defect by shorting an E fuse connected to the defective position in response to the rupture signal.

10. The repair method according to claim 8, wherein:
    one of the first and the second semiconductor chips is a chip that is actually accessed, and
    an other of the first and the second semiconductor chips is a chip is an idle chip.

11. A repair method, comprising:
    testing a semiconductor module in a state in which the semiconductor module has been mounted;
    storing defective data detected while testing the semiconductor module;
    repairing the stored defective data by replacing the stored defective data with normal data; and
    normally operating the semiconductor module,
    wherein the repairing of the stored defective data by replacing the stored defective data with normal data comprises:
    generating a rupture signal in response to a number of reset signals generated in a reset operation; and
    repairing a defect by shorting an E fuse corresponding to the defective data in response to the rupture signal.

12. The repair method according to claim 11, wherein the rupture signal is set so that the rupture signal is enabled when the number of reset signals reaches a specific number.

* * * * *